United States Patent [19]
Huang et al.

[11] Patent Number: 6,024,334
[45] Date of Patent: Feb. 15, 2000

[54] SELF-LOCKING MECHANISM FOR A SEMICONDUCTOR WAFER CASSETTE SUPPORT

[75] Inventors: Gwo-Jou Huang, Hsinchu; Ping-Yu Hu, Kaohsiung; Ton-Li Lee, Hsin-Chu; Chen-Shin Lin, Taichung, all of Taiwan

[73] Assignee: Taiwan Semiconductor Manufacturing Company, Ltd., Hsin-Chu, Taiwan

[21] Appl. No.: 09/120,407

[22] Filed: Jul. 22, 1998

[51] Int. Cl.[7] ...................................................... E04G 3/00
[52] U.S. Cl. ..................................... 248/279.1; 248/298.1
[58] Field of Search ............................. 248/279.1, 291.1, 248/284.1, 298.1, 299.1

[56] References Cited

U.S. PATENT DOCUMENTS

| | | |
|---|---|---|
| 3,603,545 | 9/1971 | Boniface .................................. 248/184 |
| 4,046,346 | 9/1977 | Iijima et al. ............................. 248/298 |
| 4,896,869 | 1/1990 | Takekoshi ................................. 269/60 |
| 5,246,218 | 9/1993 | Yap et al. ................................ 269/309 |
| 5,779,203 | 7/1998 | Edlinger ................................ 248/178.1 |
| 5,799,917 | 7/1998 | Li ......................................... 248/284.1 |
| 5,924,666 | 7/1999 | Liu ....................................... 248/286.1 |

*Primary Examiner*—Ramon O. Ramirez
*Assistant Examiner*—Walter Landry
*Attorney, Agent, or Firm*—Tung & Associates

[57] ABSTRACT

The present invention discloses a support mechanism for laterally supporting an article on a platform by utilizing a stabilizing means such that when a support plate is in an upright position to laterally support an article situated on the platform, the stabilizing means is placed in a relaxed state for stabilizing the upright position of the support member. The stabilizing means can be advantageously an extensible spring or a compressible spring to be used to modify an existing loading/unloading apparatus and to achieve the desirable benefits of the present invention method and apparatus.

20 Claims, 3 Drawing Sheets

6,024,334

SELF-LOCKING MECHANISM FOR A SEMICONDUCTOR WAFER CASSETTE SUPPORT

FIELD OF THE INVENTION

The present invention generally relates to a support mechanism for laterally supporting an article on a platform and more particularly, relates to a support mechanism for laterally supporting a wafer cassette placed on a cassette loader platform that is equipped with a stabilizing means of an extensible or compressible spring such that when the support member is in an upright position, the stabilizing means is arranged in a relaxed state for stabilizing the upright position of the support member.

BACKGROUND OF THE INVENTION

In the recent development of semiconductor fabrication technology, the continuous miniaturization in IC devices demands more stringent requirements in the fabrication environment and contamination control. When the feature size was in the 2 μm range, a cleanliness class of 100~1000 (which indicates the number of particles at sizes larger than 0.5 μm per cubic foot of air) was sufficient. However, when the feature size is reduced to 0.25 μm, a cleanliness class of 0.1 is required. It has been recognized that an inert mini-environment may be the only solution to future fabrication technologies when the device size is further reduced. In order to eliminate micro-contamination and to reduce native oxide growth on silicon surfaces, the wafer processing and the loading/unloading procedures of a process tool must be enclosed in an extremely high cleanliness mini-environment that is constantly flushed with ultrapure nitrogen that contains no oxygen or moisture.

Different approaches in modern clean room design have been pursued in recent years with the advent of the ULSI (ultra-large-scale-integrated) technology. One approach is the utilization of a tunnel concept in which a corridor separates the process area from the service area in order to achieve a higher level of air cleanliness. Under the concept, the majority of equipment maintenance functions are conducted in low-classified service areas, while the wafers are handled and processed in more costly high-classified process tunnels. For instance, in a process for 16M and 64M DRAM (dynamic random access memory) products, the requirement of contamination control in a process environment is so stringent that the control of the enclosure of the process environment for each process tool must be considered.

The stringer requirement requires a new mini-environment concept. Within the enclosure of the mini-environment of a process tool,, an extremely high cleanliness class of 0.1 (which means the number of particles at sizes larger than 0.1 μm per cubic foot of air) is maintained, when compared to a cleanliness class of 1000 for the overall production clean room area. In order to maintain the high cleanliness class inside the process tool the loading and unloading sections of the process tool must be handled automatically by an input/output device such as a SMIF (standard mechanical interfaces) apparatus. A cassette of wafer can be transported into the process tool by a SMIF pod situated-on top of the SMIF apparatus.

In a typical SMIF transfer system, an automated loading/unloading (ALU) apparatus is normally used in conjunction with the SMIF. One of such automatic loading/unloading apparatus is shown in FIG. 1. The ALU apparatus 10 is used for transporting a wafer cassette into a wafer pod and a process machine. The ALU apparatus 10 is constructed of a port plate 12, a port door 14, a cassette support 16 and a remote switch or foot operated switch 20. On top of the port door 14, a plurality of locating pins 22 are normally provided for the proper positioning of a wafer cassette on the port door 14. The locating pins 22 are important such that an accurate positioning of a wafer cassette on the port door 14 can be assured. Improperly positioned wafer cassette on the port door 14 may accidentally fall off the port door and thus cause severe breakage problems to the wafers. The cassette support 16 has a generally, laterally extending surface 26 designed in a special contour for matching to the side contour of a wafer cassette, as shown in FIG. 1. The movable port door 14 is used to unload a wafer cassette from a pod (not shown) positioned on the fixed port plate 12.

In a normal operation, the function of the ALU apparatus 10 is to deliver a wafer cassette in or out of a wafer pod (not shown) or a process chamber (not shown). For instance, a pod (not shown) can be positioned on the port plate 12 which is equipped with two sets of latch pins. The latch pins can be operated to release the pod door such that the pod door and the cassette are separated from the pod body. When the port door 14 is moved down by an elevator to a lower position, the pod door and the cassette are lowered with the port door 14. The operation of the port door 14 can be advantageously controlled by the remote or foot operated switch 20 which provides convenient remote control of the operation of the ALU apparatus 10.

The operation of the port door 14 and the cassette support 16 is shown in detail in FIGS. 2A and 2B. The port door 14 is constructed on top of a mounting box 28 as its top surface. The mounting box 28 is also constructed by a port cover 30 which contains a cavity 32 therein forming a slot opening. The port cover 30 for the mounting box 28 further includes an opening 36 facing downwardly allowing a drive means 38 to be integrally attached to a sliding block 40. The drive means 38 can be advantageously fabricated as a pin for easy adaptation to an exterior drive system (not shown) such that the drive means 38, and subsequently the sliding block 40, can be moved in a horizontal position to a maximum displacement which is equal to the length of the opening 36. At the right end 42 of the sliding block 40, a connecting plate 44 is connected pivotally through a first connecting pin 46 therethrough. At the opposite end of the connection plate 44, a connecting rod 50 is pivotally connected by a second connecting pin 52.

In order for the connecting rod 50 to rotate the cantilever arm 54 and the cassette support plate 56, the connecting rod 50 is fixed to the mounting box 28 through an aperture 62 by a third connecting pin 64. The fluid connecting pin 64 is attached to the end panels (not shown) of the mounting box 28. To control the movement of the cassette support plate 56 accurately, the connecting rod 50 must be rigidly attached to the cantilever arm 54. This is accomplished by a mechanical means, such as a bolt 58 shown in FIG. 2A and 2B. At the other end of the cantilever arm 54, the cassette support plate 56 is attached thereto by mechanical means, such as bolts 68. It should be noted that while the cassette support plate 56 is shown with a flat surface 66, the surface 66 is more likely contoured to match the contour of a wafer cassette in a lateral direction. The length of the cantilever arm 54 can be suitably adjusted, so are the lateral dimensions of the cassette support plate 56, such that different sized wafer cassettes may be carried and supported (or cradled) by the cassette support plate 56 when placed in an upright position on top of the port door 34.

A detailed drive mechanism for the cassette support plate 56 is shown in FIG. 2B. The main drive system for the cassette support plate 56 consists of a sliding block 40, connecting plate 44 and connecting rod 50. The sliding block 40 is an elongated block constructed of a rigid material. It is housed in a mounting box 28 constructed of a port cover 30 and a port door 34. The port cover 30 is assembled, with the sliding block 40 housed therein, to the port plate 34 by mechanical means such as bolts 68. The port cover 30 and the port plate 34 are constructed of a rigid material such as aluminum or other suitable metal such that the integrity of the mounting box 28 is ensured. The rigidity of the mounting box is important in order for the sliding block 40 to slide smoothly inside cavity 32 of the mounting box 28. As shown in FIG. 2A, the sliding block 40 is mounted in a horizontal position and is allowed to move only in a horizontal direction. The mounting block 40 is equipped, at the left end 48, with a drive means 38. The drive means 38, as shown in FIG. 2A, is a simple pin device that can be engaged by an external drive means (not shown) such as that of a SMIF loader. The drive means 38, when engaged by the external drive means, moves the sliding block 40 in a horizontal direction to the right until the opposite end 60 is stopped by the surface 70 of the end wall 72 of the port cover 30.

At the opposite end 60 of the sliding block 40, a connecting plate 44 is pivotally connected by pin 46 through an aperture (not shown) in the sliding block 40. At the other end of the connecting plate 44, a second connecting pin 52 is used to pivotally connect the connecting plate 44 to the upper end 74 of the connecting rod 50. The connecting rod 50 is pivotally connected at the upper end 74 through an aperture 64 by a third connecting pin 62. The third connecting pin 62 is further attached to the end walls (not shown) of the port cover 30. The third connecting pin 62 allows the connecting rod 50 to swing on an axis provided by the third connecting pin 62. The swinging motion of the connecting rod 50, as shown in FIGS. 2A and 2B, is designed such that when the mounting block 40 is pushed by the connecting rod 50 (through the connecting plate 44) to a left-most position, the connecting rod 50 is in a perpendicular position to the longitudinal axis of the sliding block 40. On the other hand, when the sliding block 40 is pushed to the right-most position, as shown in FIG. 2B, by the drive means 3 8 and an exterior drive means such that the end 60 of the sliding block 40 is stopped by the end wall 70 of the port cover 30, the connecting rod 50 swings on the third connecting pin 62 when pushed by the connecting plate 44 to a position that is horizontal to the longitudinal axis of the sliding block 40.

When the sliding block 40 is pushed to the right-most position, as shown in FIG. 2B, the connecting plate 44 is perpendicular to the longitudinal axis of the sliding block 40. Ideally, when the connecting plate 44 and the longitudinal axis of the sliding block 40 are in a 90° relationship, the connecting plate/sliding block assembly is in a self-locked position. In other words, even if a vertically downward force is applied onto the cassette support 16, the force acting in a perfectly vertical direction on the first connecting pin 46 and therefore, there is no horizontal component of the force to cause the sliding block 40 to move horizontally. However, this ideal situation does not exist in real life due to a variety of reasons. For instance, the manufacturing process for the sliding block allows a small tolerance in its dimensions, and secondly, there may have been wear on the surface of the sliding block 40 after prolonged usage of the loader/unloader apparatus. Furthermore, any vibration of the loader/unloader apparatus may cause the sliding block to move away from the position where the connecting plate 44 is in a perfect 90° angle to the longitudinal axis of the sliding block 40. For instance, the sliding block 40 may be moved slightly to the left and thus causing a non-perfect vertical force to act on the first connecting pin 46 when a vertical downwardly force is applied on the cassette support 16. The non-perfect vertical force acting on the first connecting pin 46 thus produces a horizontal component of the downward force and causing the sliding block 40 to move to the left away from the perfectly perpendicular position shown in FIG. 2B. This new position is shown as ghost lines 74. At such a position, the self-locking function which existed when the connecting plate 44 and the sliding block 40 were in perfectly perpendicular position non longer exists. As a result, the cassette support 16 may swing downwardly in a clockwise direction causing the wafer cassette to slide off the port door 34. This is a serious problem which may lead to wafer breakage and thus a severe drop in wafer yield from the process machine.

It is therefore an object of the present invention to provide a support mechanism for laterally supporting an article on a platform that does not have the drawbacks and shortcomings of the conventional support systems.

It is another object of the present invention to provide a support mechanism for laterally supporting an article on a platform by utilizing a stabilizing means that can be easily added to an existing apparatus.

It is a further object of the present invention to provide a support mechanism for laterally supporting an article on a platform that provides a self-locking function when the support mechanism is in an upright position.

It is another further object of the present invention to provide a self-locking support assembly that utilizes a tension means such that when the support member is in an upright position, the tension means is in a relaxed state for stabilizing the upright position of the support member.

It is still another object of the present invention to provide a self-locking support assembly by utilizing an extensible spring means such that when the support member is in an upright position, the extendable spring means is in a relaxed state for stabilizing the upright position of the support member.

It is yet another object of the present invention to provide a self-locking support assembly by utilizing a compression means such that when the support member is in an upright position, the compression means is in a relaxed state for stabilizing the upright position of the support member.

It is still another further object of the present invention to provide a stabilized support assembly that utilizes a compression means for stabilizing a support member such that when the support member is in an upright position, the compressible spring is in a relaxed state for stabilizing the upright position of the support member.

It is yet another further object of the present invention to provide a self-locking support assembly utilizing an extensible spring for stabilizing a cassette support plate for supporting a wafer cassette situated on a port cover in a lateral direction.

SUMMARY OF THE INVENTION

The present invention discloses a support mechanism for laterally supporting an article on a platform by utilizing a stabilizing means such that when a support member is in an upright position, the stabilizing means is in a relaxed state for stabilizing the upright position of the support member.

In a preferred embodiment, a support mechanism for laterally supporting an article on a platform is provided which includes a support member having a laterally extending surface for supporting an article in a lateral direction when the support member is in a substantially upright position, a cantilever arm having one end rigidly attached to the support member and the other end rigidly attached to a connecting rod, an elongated sliding block engaging a slot opening in a mounting box adapted for horizontal movement in the opening, the block has a first end equipped with a drive means for sliding the block and a second end equipped with a connection means for pivotally connecting to the connecting rod, and a stabilizing means which has a first end connected to the sliding block and a second end connected to an end wall of the mounting box, whereby when the sliding block is pushed to an extreme right position in the slot opening, the support member stays in an upright position with the stabilizing means in a relaxed state for stabilizing the upright position of the support member.

In an alternate embodiment, a self-locking support assembly is provided which includes a support member that has a laterally extending surface for supporting an article in a lateral direction when the support member is in a substantially upright position, a cantilever arm that has one end rigidly attached to the support member and the other end attached to a connecting rod, an elongated sliding block engaging a slot opening in a mounting box adapted for horizontal movement in the opening, the block has a first end equipped with a drive means for sliding the block and a second end equipped with a connection means for pivotally connecting to the connecting rod, and a tension means which has a first end connected to the sliding block and a second end affixed to a right-most end wall of the mounting box, whereby when the sliding block is pushed to an extreme right position in the slot opening, the support member stays in an upright position with the tension means in a relaxed state for stabilizing the upright position of the support member.

In another alternate embodiment, a stabilized support assembly is provided which includes a support member that has a laterally extending surface for supporting an article in a lateral direction when the support member is in a substantially upright position, a cantilever arm that has a first end rigidly attached to the support member and a second end attached to a connecting rod, an elongated sliding block that engages a slot opening in a mounting box adapted for horizontal movement in the opening, the block has a first end equipped with a drive means for pushing the block and a second end equipped with a connection means for pivotally connecting to the connecting rod, and a compression means that has a first end connected to the sliding block and a second end affixed to the left-most end wall of the mounting box, whereby the sliding block is pushed to the extreme right position in the slot opening, the support members stays in an upright position with the compression means in a relaxed state for stabilizing the upright position of the support member.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND THE ALTERNATE EMBODIMENTS

The present invention discloses a support mechanism for laterally supporting an article on a platform by utilizing a stabilizing means which helps to stabilize a support member to stay in an upright position without the danger of falling and thus failing its lateral support function to an article placed on a platform of a loading/unloading apparatus.

The present invention novel apparatus can be constructed in several different embodiments. For instance, in a preferred embodiment, an extensible spring is used as the stabilizing means that is connected to a sliding block at one end and to an end wall of a mounting box at the other end such that when the sliding block is pushed to an extreme right position to raise the support member into an upright position, the extensible spring is in a relaxed state to help stabilizing the upright position of the support member.

The present invention novel apparatus can also be provided with a stabilizing means of a compressible spring which has one end connected to a sliding block and the other end connected to a left-most end wall of the mounting box such that when the sliding block is pushed to an extreme right position for raising the support member into an upright position, the compressible spring is in a relaxed state to stabilize the upright position of the support member.

Figure 1:
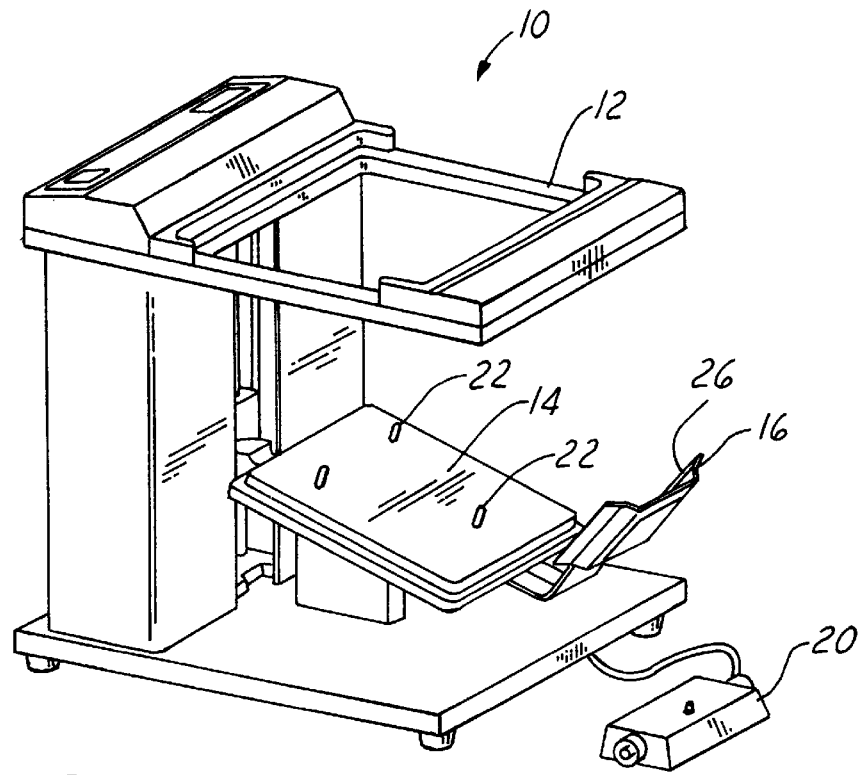
FIG. 1 is a perspective view of a conventional automated loading/unloading apparatus for a wafer cassette.
Figure 4:
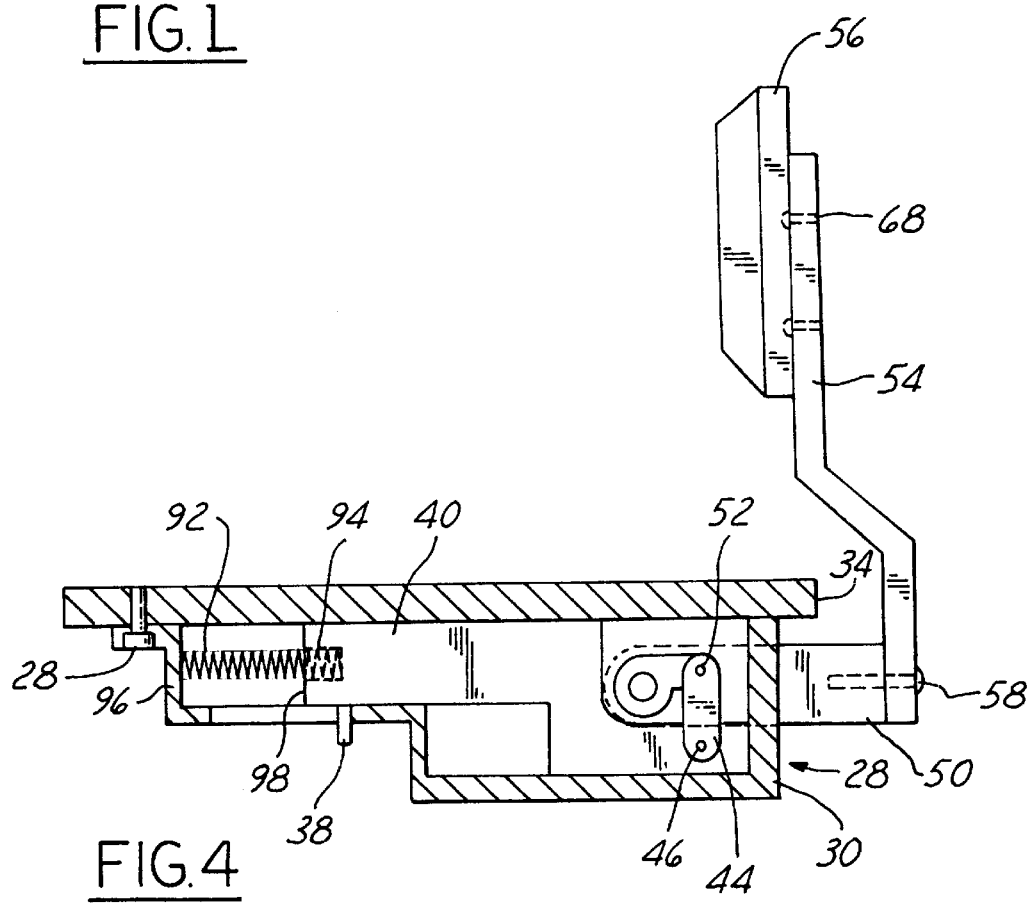
FIG. 4 is a side view of an alternate embodiment of the present invention cassette loading/unloading apparatus wherein a compressible spring is utilized as the stabilizing element.
Figure 3A:
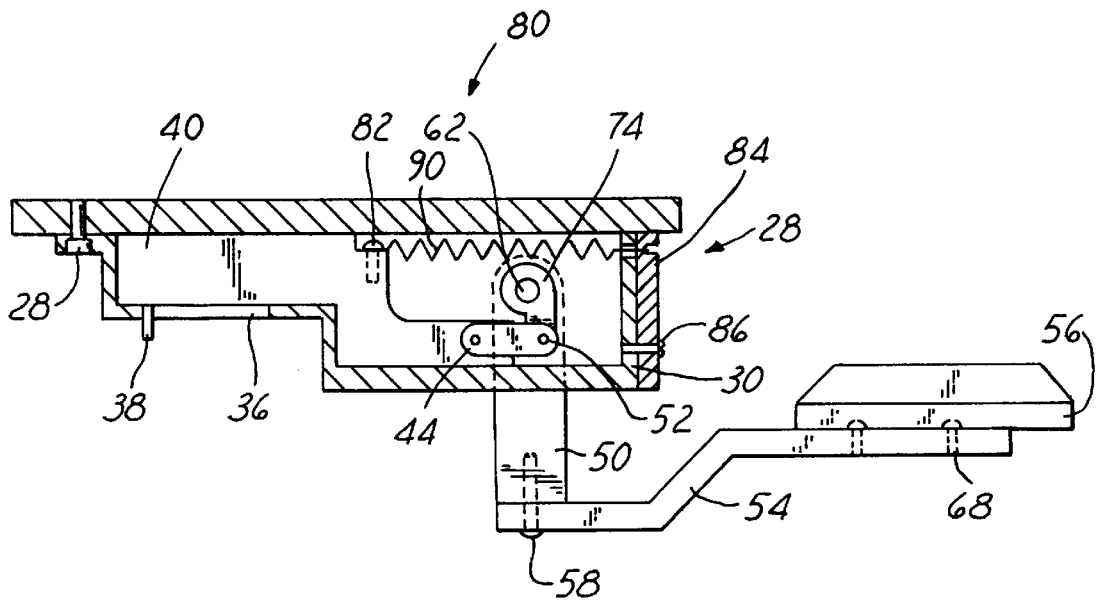
FIG. 3A is a side view of the present invention loading/unloading apparatus showing the cassette support plate horizontal position.
Figure 3B:
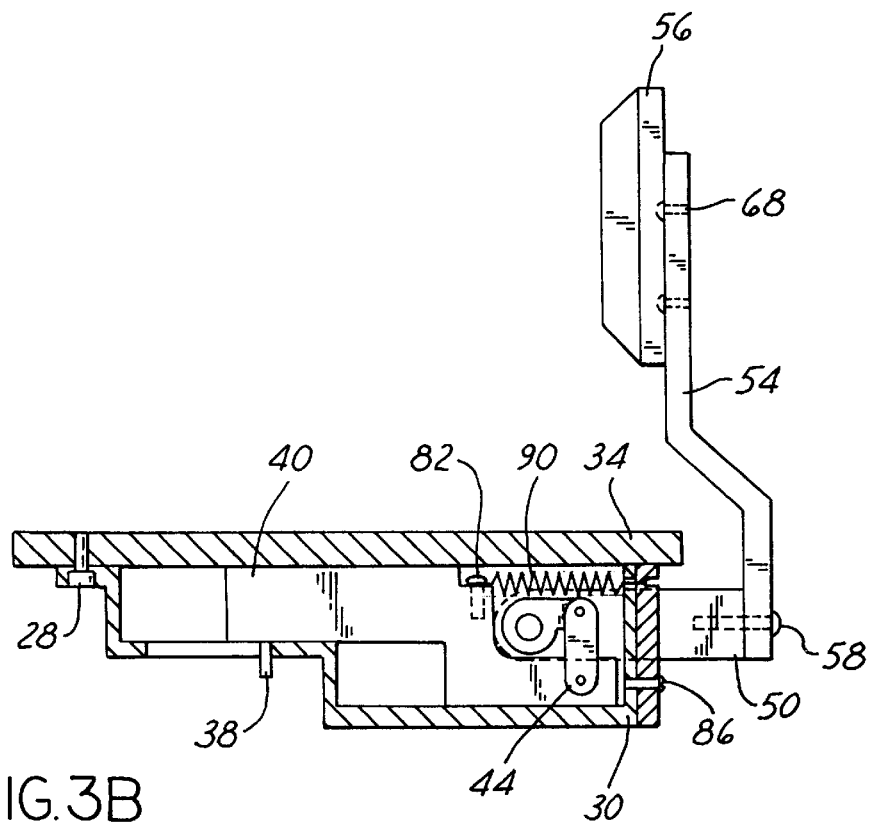
FIG. 3B is a side view of the present invention cassette loading/unloading apparatus with the cassette support plate in a self-locked upright position.

The present invention novel apparatus in its preferred and its alternate embodiment is shown in FIGS. 3A, 3B and 4.

Figure 2A:
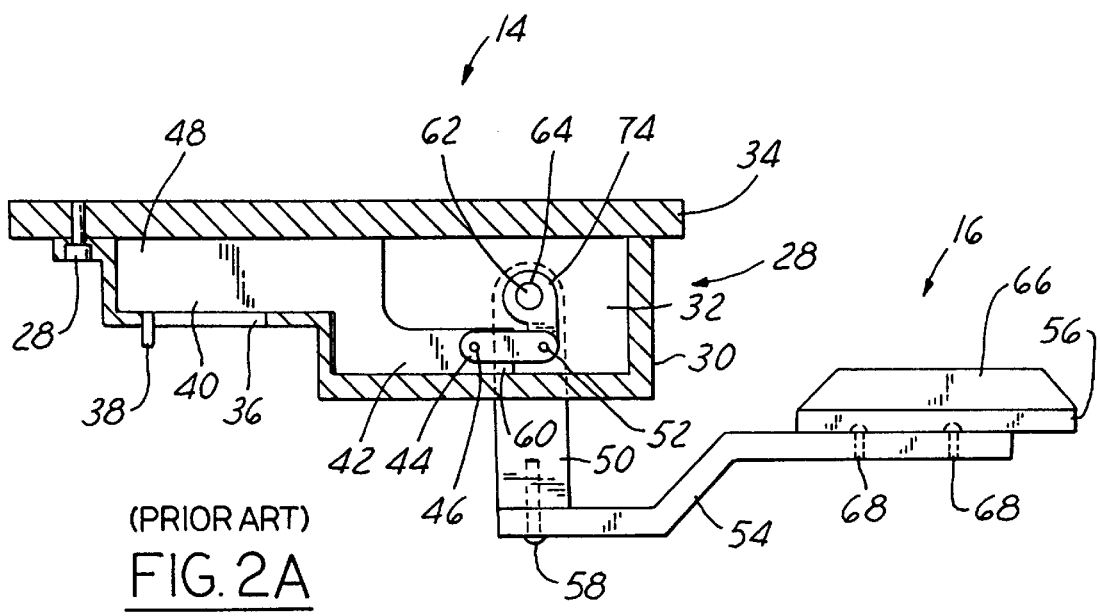
FIG. 2A is a side view of the cassette support plate and the mounting box with its components contained therein for a conventional cassette loading/unloading apparatus.
Figure 2B:
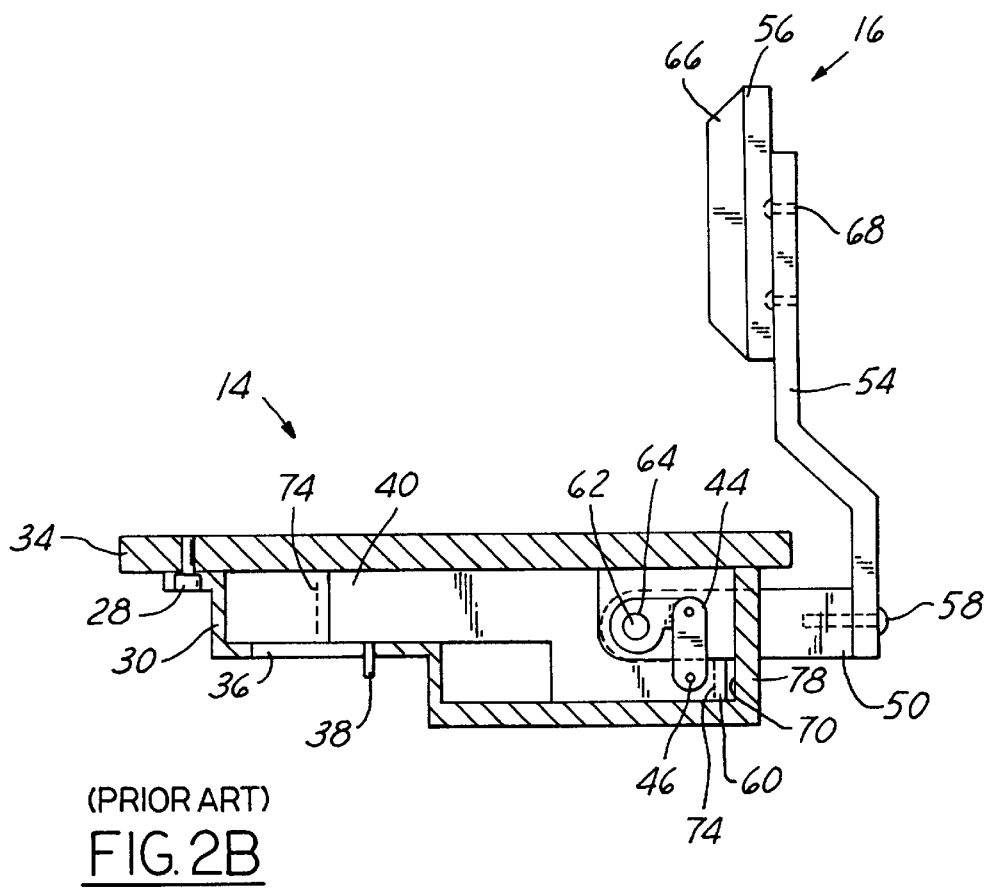
FIG. 2B is a side view of the conventional loading/unloading apparatus of FIG. 2A with the cassette support plate in an upright position.

Referring now to FIG. 3A, where it is shown the present invention support mechanism 80. The support mechanism 80 is constructed by a mounting box 28, a cassette support plate 56, a cantilever arm 54 and a connecting rod 50. The major components in the mounting box 28, i.e. the sliding block 40, the connecting plate 44, the third connecting pin 62 and the upper end 74 of the connecting rod 50 are the same as that shown in FIGS. 2A and 2B.

The present invention novel apparatus of a stabilized, self-locking support mechanism utilizes a stabilizing means such as an extensible spring 90 shown in FIG. 3A. The extensible spring 90 is attached at one end by a mechanical means 82 such as a screw to the sliding block 40. At the other end, the extensible spring 90 is attached by a mounting plate 84 mechanically attaching to the port cover 30 by screw 86. As shown in FIG. 3A, when the support plate 56 is in a down, or horizontal position, the extensible spring 90 is fully extended with the sliding block 40 pushed to the left-most position by the drive means 38. At this position, the extensible spring 90 is fully extended and therefore the sliding block/support plate mechanism is in an unstable condition.

In contrast to the unstable condition shown in FIG. 3A, FIG. 3B shows a stabilized condition of the present invention sliding block/support plate mechanism when the sliding block 40 is pushed to the right-most position by the drive means 38. At a completely relaxed (or very slightly extended) position of the extensible spring 90, the stabilizing action of the spring assists in keeping the cassette support plate 56 to stay in an upright position. The stabilizing means 90 therefore prevents the cassette support plate 56 from accidentally swinging clockwise away from its upright position and therefore assures the lateral support function of the plate 56. This lateral support function is ensured even when the sliding block 40 may be moving slightly away from its perfectly perpendicular relationship with the connecting rod 44. For instance, when the sliding block is slightly worn or when the loading/unloading machine is under a vibrational force such that the sliding block and the connecting plate 44 no longer remain in a perfectly perpendicular relationship. Any component force in the horizontal direction (and to the left) exerted on the sliding block 40 by the connecting plate 44 due to the weight of the support plate 56 and the cantilever arm 54 is counter acted by the retracted extensible spring 90. The stabilizing means of the spring 90 therefore ensures the support plate 56 to stay securely in such an upward position. Any possible falling of the support plate 56 and the resulting falling of a wafer cassette from the port door 34, as that frequently seen in a conventional loading/unloading apparatus, are therefore completely avoided.

The present invention novel apparatus may further be provided with a stabilizing means that is a compressible spring 92, as shown in FIG. 4. The stabilizing means of the extensible spring 90 used in the preferred embodiment is replaced by a compressible spring 92. The compressible spring 92 may be rigidly attached at one end to the end wall 96 of the port cover 30, and at the other end to a mounting seat 94 situated in the end surface 98 of the sliding block 40. The stabilizing means in the alternate embodiment works similarly to that of the preferred embodiment, except that the stabilizing means works in a compressive mode instead of in an extensive mode. For instance, as shown in FIG. 4, when the sliding block 40 is pushed to the right-most position by the drive means 38, the compressible spring 92 is in a non-compressed, or relaxed mode. The uncompressed stabilizing means of spring 92 therefore stabilizes the upright position of the support plate 56 and prevents it from accidentally falling. When the support plate 56 is in a down, or horizontal position (not shown), the sliding block 40 is slid to the left-most position (not shown) by the operation of the drive means 38. At such a position, the compressible spring 92 is fully compressed and therefore the sliding block/support plate assembly is in an unstable condition in contrary to the stabilized condition when the support plate was in an upright position. The alternate embodiment of the present invention may be utilized in situations where it is easier to mount the stabilizing means, i.e., the compressible spring inside the mounting box 28.

The present invention novel apparatus and method for stabilizing a support mechanism to laterally support an article on a platform have therefore been amply demonstrated in the above descriptions and the appended drawings of FIGS. 3A, 3B and 4. It should be noted that, while the present invention novel apparatus and method were demonstrated by a wafer cassette support system, they can be utilized for any other loading/unloading systems wherein lateral support on an article situated on a loading/unloading platform is desired. The present invention novel method and apparatus are therefore in no way limited to machines or devices utilized in semiconductor processing.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

1. A support mechanism for laterally supporting an article on a platform comprising:
   a support member having a laterally extending surface for supporting an article situated on said surface in a lateral direction when said support member is in a substantially upright position,
   a cantilever arm having one end rigidly attached to the support member and the other end rigidly attached to a connecting rod,
   an elongated sliding block engaging a slot opening in a mounting box adapted for horizontal movement in said opening, said block having a first end equipped with a drive means for sliding the block and a second end equipped with a connection means for pivotally connecting to said connecting rod, and
   a stabilizing means having a first end connected to said sliding block and a second end affixed to an end wall of said mounting box, whereby when said sliding block is pushed to an extreme right position in said slot opening, said support member stays in an upright position with said stabilizing means in a relaxed state for stabilizing said upright position of said support member.

2. A support mechanism according to claim 1, wherein said connecting rod pivotally swings on a shaft affixed to said mounting box.

3. A support mechanism according to claim 1, wherein said connection means for said sliding block is a connecting plate having one end pivotally connected to said sliding block and the other end pivotally connected to said connecting rod such that when said sliding block is pushed to the right by said drive means, said connecting rod pivotally swing on said shaft in a counter-clockwise direction to raise said support member to an upright position.

4. A support mechanism according to claim 1, wherein said stabilizing means is in a most unstable position when said sliding block is pushed to a left-most position in said slot opening.

5. A support mechanism according to claim 1, wherein said drive means on said sliding block is a pin for engaging to an exterior drive means.

6. A support mechanism according to claim 1, wherein said support member is a wafer cassette support in a wafer loading apparatus.

7. A support mechanism according to claim 1, wherein said mounting box for said sliding block has a top surface which functions as a platform for holding a wafer cassette, said wafer cassette being laterally supported by said support member.

8. A support mechanism according to claim 1, wherein said stabilizing means is a spring.

9. A self-locking support assembly comprising:
   a support member having a laterally extended surface for supporting an article in a lateral direction on said surface when said support member is in a substantially upright position,
   a cantilever arm having one end rigidly attached to the support member and the other end attached to a connecting rod, an elongated sliding block engaging a slot opening in a mounting box adapted for horizontal movement in said opening, said block having a first end equipped with a drive means for sliding the block and a second end equipped with a connection means for pivotally connecting to said connecting rod, and a tension means having a first end connected to said sliding block and a second end affixed to a right-most end wall of said mounting box, whereby when said sliding block is pushed to an extreme right position in said slot opening, said support member stays in an upright position with said tension means in a relaxed state for stabilizing said upright position of said support member.

10. A self-locking support assembly according to claim 9, wherein said connecting rod pivotally swings on a pin affixed to said mounting box.

11. A self-locking support assembly according to claim 9, wherein said connection means for said sliding block is a connecting plate having one end pivotally connected to said sliding block and the other end pivotally connected to said connecting rod such that when said sliding block is pushed to the right by said drive means, said connecting rod pivotally swing on a pin in a counter-clockwise direction to raise said support member to a substantially upright position.

12. A self-locking support assembly according to claim 9, wherein said spring is in a fully extended position when said sliding block is pushed to a left-most position in said slot opening.

13. A self-locking support assembly according to claim 9, wherein said drive means on said sliding block is a pin for engaging to an exterior drive means.

14. A self-locking support assembly according to claim 9, wherein said support member is a wafer cassette support in a wafer loading apparatus.

15. A self-locking support assembly according to claim 9, wherein said mounting box for said sliding block has a top surface which functions as a platform for holding a wafer cassette, said wafer cassette being laterally supported by said support member.

16. A self-locking support assembly according to claim 9, wherein said tension means is a spring.

17. A stabilized support assembly comprising:

a support member having a laterally extended surface for supporting an article in a lateral direction on said surface when said support member is in a substantially upright position, a cantilever arm having a first end rigidly attached to the support member and a second end attached to a connecting rod, an elongated sliding block engaging a slot opening in a mounting box adapted for horizontal movement in said opening, said block having a first end equipped with a drive means for pushing the block and a second end equipped with a connection means for pivotally connecting to said connecting rod, and a compression means having a first end connected to said sliding block and a second end affixed to the left-most end wall of said mounting box, whereby when said sliding block is pushed to an extreme right position in said slot opening, said support member stays in an upright position with said compression means in a relaxed state for stabilizing said upright position of said support member.

18. A stabilized support assembly according to claim 17, wherein said compression means is a compressible spring.

19. A stabilized support assembly according to claim 17, wherein said connection means for said sliding block is a connecting plate having one end pivotally connected to said sliding block and the other end pivotally connected to said connecting rod such that when said sliding block is pushed to the right by said drive means, said connecting rod pivotally swing on a pin in a counter-clockwise direction to raise said support member to an upright position.

20. A stabilized support assembly according to claim 17, wherein said compression means is in a fully compressed position when said sliding block is pushed to a left-most position in said slot opening.

* * * * *